United States Patent
Pessl

(10) Patent No.: US 7,542,254 B2
(45) Date of Patent: *Jun. 2, 2009

(54) METHOD FOR PRODUCING A PROTECTIVE ASSEMBLY FOR PROTECTING AN ELECTRONIC COMPONENT FROM ELECTROSTATIC DISCHARGE, AND CORRESPONDINGLY CONFIGURED ELECTRONIC COMPONENT

(75) Inventor: Peter Pessl, Einsteinweg (AT)

(73) Assignee: Infineon Technologies AG, Munich (DE)

( * ) Notice: Subject to any disclaimer, the term of this patent is extended or adjusted under 35 U.S.C. 154(b) by 392 days.

This patent is subject to a terminal disclaimer.

(21) Appl. No.: 11/392,216

(22) Filed: Mar. 29, 2006

(65) Prior Publication Data
US 2006/0268488 A1  Nov. 30, 2006

(30) Foreign Application Priority Data
Mar. 29, 2005  (DE)  .................... 10 2005 014 176

(51) Int. Cl.
    *H02H 9/00* (2006.01)
(52) U.S. Cl. .......................................... 361/56
(58) Field of Classification Search ............ 361/56
    See application file for complete search history.

(56) References Cited

U.S. PATENT DOCUMENTS

| | | | |
|---|---|---|---|
| 5,991,135 A * | 11/1999 | Saleh | 361/56 |
| 6,433,985 B1 | 8/2002 | Voldman et al. | |
| 6,624,999 B1 * | 9/2003 | Johnson | 361/113 |
| 2002/0121668 A1 | 9/2002 | Gossner | |
| 2003/0209793 A1 | 11/2003 | Nishizawa et al. | |

FOREIGN PATENT DOCUMENTS

| | | |
|---|---|---|
| DE | 199 44 487 A1 | 4/2001 |
| DE | 199 44 489 A1 | 4/2001 |
| EP | 1 168 607 A2 | 1/2001 |

* cited by examiner

*Primary Examiner*—Stephen W Jackson
(74) *Attorney, Agent, or Firm*—Brinks Hofer Gilson & Lione

(57) ABSTRACT

An electronic component includes a first circuit portion having a first supply voltage terminal and a second circuit portion having a second supply voltage terminal. The electronic component includes a first external supply voltage line that supplies the first circuit portion, and a second external supply voltage line that supplies the second circuit portion. The second supply voltage terminal is connected to the second external supply voltage line, and to an electrical connection, which does not run via the first external supply voltage line, between the second external supply voltage line and the first supply voltage terminal. The first circuit portion is isolated from the second circuit portion with respect to high-frequency interference, while electrostatic discharge may propagate via the supply voltage system of the electronic component.

20 Claims, 4 Drawing Sheets

METHOD FOR PRODUCING A PROTECTIVE ASSEMBLY FOR PROTECTING AN ELECTRONIC COMPONENT FROM ELECTROSTATIC DISCHARGE, AND CORRESPONDINGLY CONFIGURED ELECTRONIC COMPONENT

BACKGROUND

1. Priority Claim

This application claims the benefit of priority from German Patent Application No. DE 10 2005 014 176.5, filed Mar. 29, 2005, which is incorporated by reference herein.

2. Technical Field

The disclosure generally relates to a method for producing a protective assembly for protecting an electronic component from electrostatic discharge (ESD), in particular to allowing non-diverted electrostatic discharge to propagate between various portions of the circuit, the propagation of high-frequency interference at the same time being prevented.

3. Related Art

There is a need to protect integrated circuits from electrostatic discharge (ESD) caused, for example, by contact with a person. A circuit may be provided, for example, with protective elements at bond pads of the circuit, which are circuit input or output terminals. The protective elements divert an electrostatic discharge to a circuit supply potential, such as a positive supply voltage, a negative supply voltage, or a ground line. Protective elements of this type are described, for example, from US 6,433,985 B1, the whole content of which is incorporated by reference for all purposes.

In addition, a remaining portion of the electrostatic discharge, i.e. a portion that was not diverted to the outside by the protective elements and via the supply potential, is allowed to propagate via a supply voltage system of the integrated circuit. In the event of an electrostatic discharge, any voltage drop in or on the integrated circuit must be kept as low as possible in order to be able to ensure effective protection of susceptible circuit parts. In addition, the path for propagation via the supply voltage system should be configured in such a way that, during normal operation of the circuit, interference signals generated in a portion of the integrated circuit are not able to propagate in an arbitrary fashion via this propagation path. Propagation between a digital part of the circuit and an interference-susceptible analog part of the circuit should, for example, be prevented.

For this purpose, it may be possible to connect two antiparallel diodes between a supply voltage line of a first circuit portion and a supply voltage line of a second circuit portion. These diodes are configured in such a way that, even in the forward direction, a specific voltage must be applied for them to become conductive.

If, for example, a portion of electrostatic discharge is then applied to the supply voltage line of the first circuit portion, the voltage thereby produced is sufficient for a correspondingly polarized diode of the antiparallel diodes to become conductive, thus enabling the electrostatic discharge to propagate to the supply voltage line of the second circuit portion. High-frequency interference, on the other hand, which conventionally has substantially lower voltages than electrostatic discharge, is not able to propagate via the antiparallel diodes. The first circuit portion may therefore be isolated from the second circuit portion with respect to high-frequency interference.

A drawback of this configuration may be that in the event of electrostatic discharge, there may be a relatively high voltage drop across the antiparallel diodes, leading to a corresponding increase in voltage at the parts to be protected in the circuit. Configurations of this type may therefore not be used in what are known as low-voltage technologies, since maximum tolerable voltages at the circuit portions may be exceeded.

It has been proposed, in this regard, to provide within the integrated circuit a connection, having a specific minimum inductance, between the supply voltage line of the first circuit portion and the supply voltage line of the second circuit portion. Isolation may be achieved in the case of high-frequency interference signals, while electrostatic discharge is able to propagate almost unimpeded. However, a solution of this type disadvantageously takes up chip surface area, and this increases the production costs. Moreover, a solution of this type may not be used in electronic components in which two chips are integrated in a single component.

Therefore a need exists for producing a protective assembly for protecting an electronic component from electrostatic discharge, wherein electrostatic discharge is able to propagate via a supply voltage system of circuit portions contained in the electronic component, while the propagation of high-frequency interference is prevented. It should be possible to carry out the method cost-effectively and, in particular, to use the method for what are known as laminate packages such as, for example, ball grid arrays (BGAs), in which external terminals consist of "solder balls" conventionally attached to the lower side of the packaging of the electronic component.

SUMMARY

A protective assembly for protecting an electronic component from electrostatic discharge includes an electronic component with a first circuit portion. The first circuit portion includes a first supply voltage terminal. A second circuit portion includes a second supply voltage terminal. The electronic component includes a first external supply voltage line that supplies the first circuit portion, and a second external supply voltage line that supplies the second circuit portion. The second supply voltage terminal is wired to the second external supply voltage line to provide an electrical connection, which does not run via the first external supply voltage line, between the second external supply voltage line and the first supply voltage terminal. The term "external supply voltage lines" generally refers to supply voltage lines located outside the first circuit portion or the second circuit portion, i.e., for example, in a package containing the first circuit portion and the second circuit portion.

The electrical connection allows electrostatic discharge to be diverted from the second supply voltage terminal of the second circuit portion to the first supply voltage terminal of the first circuit portion and vice versa. There is therefore also a connection between the first and the second external supply voltage lines.

BRIEF DESCRIPTION OF THE DRAWINGS

The invention will be described below in greater detail on the basis of embodiments and with reference to the accompanying drawings which are provided for illustration only and not to be construed as limiting the scope of the disclosure, in which.

DETAILED DESCRIPTION

Figure 1:
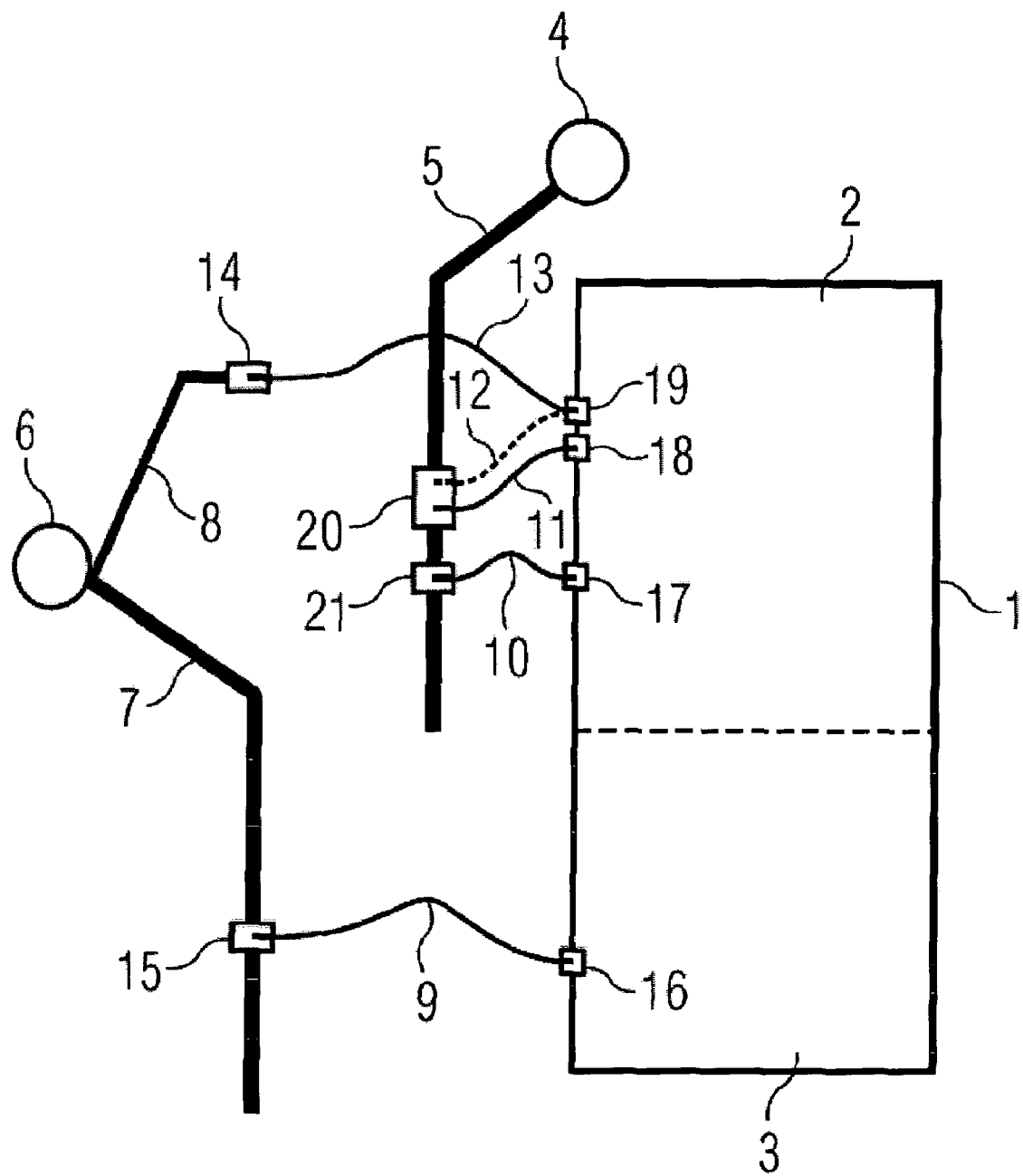
FIG. 1 illustrates an example protective device for electrostatic discharge protection of an electronic component.

FIG. 1 an example protective device for electrostatic discharge protection of an electronic component, in which a chip 1 is integrated in an electronic component. The chip may have an integrated semiconductor circuit, which includes a first circuit portion 2 and a second circuit portion 3. The first circuit portion 2 is a circuit portion susceptible to high-frequency interference, for example an analog circuit portion, while the second circuit portion 3 is a circuit portion that potentially produces high-frequency interference, for example a digital circuit portion. The protective device may be used with any type of circuit portion. The circuit portions are not described in detail. The circuit portions may include any kind of circuit, like a logic circuit, a memory circuit, a communication circuit, or other integrated or discrete circuits.

The first circuit portion 2 and the second circuit portion 3 include separate internal voltage supply systems. This voltage supply will be described below with reference to ground lines, though the protective device may easily be applied to other voltage supplies such as, for example, a positive voltage supply.

The first circuit portion 2 includes bondpads 17, 18 and 19 as ground connections connected to an internal ground line of the first circuit portion 2. An external ground line 5, which ends in a solder ball 4 of a ball grid array, is associated with the first circuit portion 2. The solder ball 4 is therefore an external ground connection of the electronic component. The first external ground line 5 includes bondpads 20 and 21. The bondpad 21 is connected to the bondpad 17 via a bonding wire 10, and the bondpad 20 is connected to the bondpad 18 via a bonding wire 11. The internal ground line of the circuit portion 2 is thus connected to the first external ground line 5 via the bondpads 17 and 18.

Similarly, the second circuit portion 3 includes a ground connection 16, which may be also configured as a bondpad. The ground connection 16 is connected to a bondpad 15 of a second external ground line 7, which also has a solder ball 6 as an external terminal, via a bonding wire 9.

A ground potential for the first circuit portion 2 is thus provided via the ground line 5, as is a ground potential for the second circuit portion 3 via the ground line 7.

The illustrated electronic component includes a branch line 8, which issues from the solder ball 6 and ends in a bondpad 14. The bondpad 14 is, again, connected to the bondpad 19 of the first circuit portion 2 via a bonding wire 13. The electrical connection, including the branch line 8 and bonding wire 13, may be configured in such a way that its inductance is between 5 and 15 nH, as may be achieved by suitable configuration of the branch line 8 or the bonding wire 13.

The first external ground line 5, the second external ground line 7 and the branch line 8 are electrical connections that extend within what is known as the package of the electronic component. The lines may be formed, for example, by a metal layer. These connections do not need any surface area on the chip 1 and may therefore be produced more cost-effectively than measures taken on the chip itself.

A bonding wire 12 may be provided, as indicated by broken lines, between the ground connection 19 and the bondpad 20.

This optional bonding wire 12 may be provided if performance problems occur—for example, in a development phase of the electronic component. An arrangement without the bonding wire 12 is, however, more robust in terms of behaviour in the event of electrostatic discharge. The bonding wire 12 may easily be provided as required.

Figure 2:
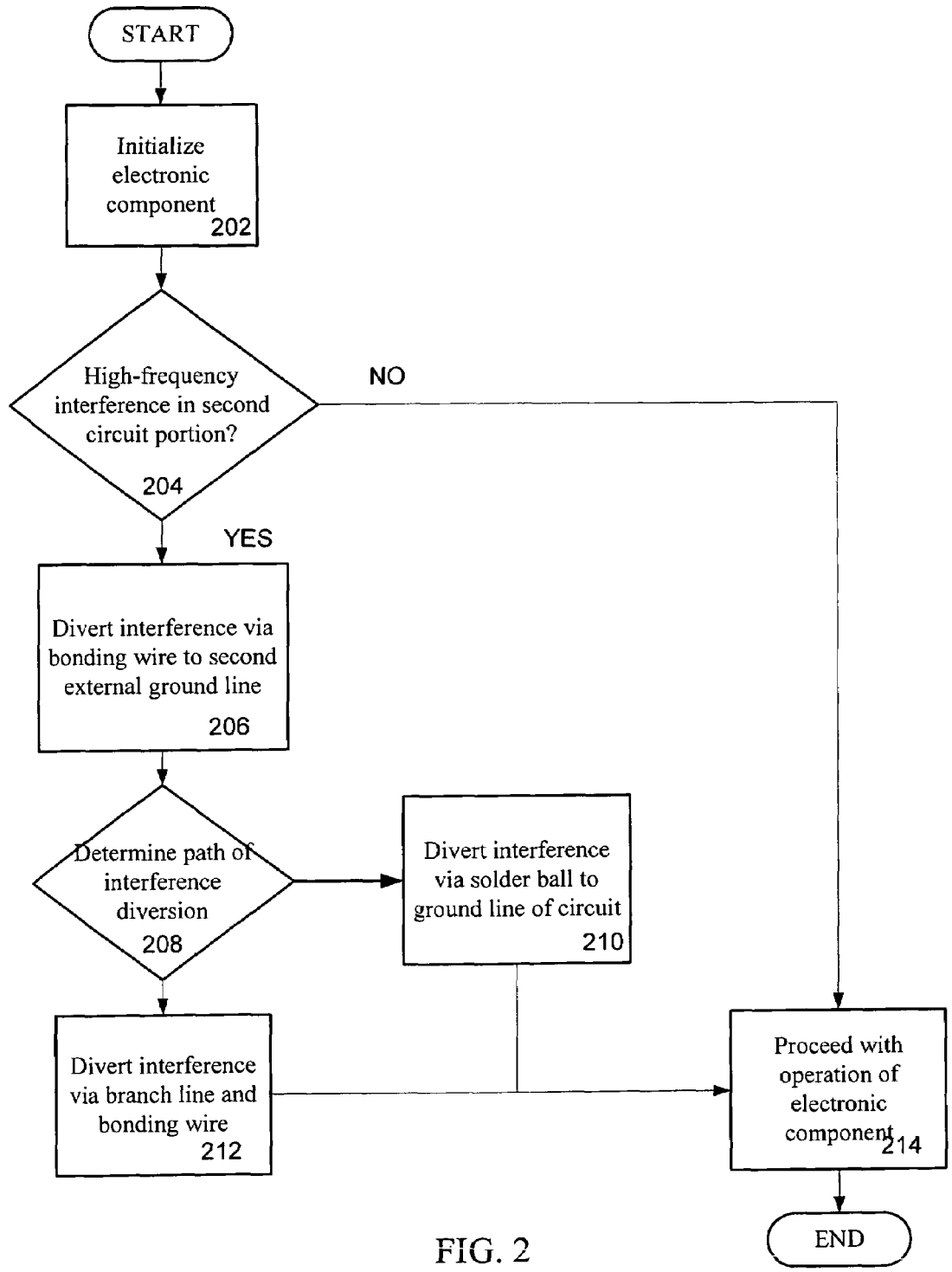
FIG. 2 illustrates acts taken to protect an electronic component.

FIG. 2 illustrates interrelated acts that divert an interference event. The process may initialize the electronic component 1 for operation (Act 202). If high-frequency interference occurs in the second circuit portion 3 (Act 204), it is initially diverted via the bonding wire 9 to the second external ground line 7 (Act 206), from where the process may determine, in principle, two possible propagation paths (Act 208). The interference may be diverted to the outside via the solder ball 6 (Act 210), i.e. in the built-in state of the electronic component, to a ground line of a corresponding printed circuit. A propagation path to the ground connection 19 of the first circuit portion 2 via the branch line 8 and the bonding wire 13 is (Act 212), in principle, also possible. However, because the inductance of the electrical connection, consisting of the branch line 8 and bonding wire 13, was selected in an appropriate manner, in particular between 5 and 15 nH, this electrical connection has substantially higher impedance for high-frequency interference than the outward propagation path via the solder ball 8. The high-frequency interference is therefore diverted to the outside substantially in its entirety via the solder ball 8, and the interference-susceptible first circuit portion 2 is protected from high-frequency interference of the second circuit portion 3. If there is no high-frequency interference event detected at Act 204, or after a high-frequency interference event had been diverted, the process may continue with operation of the electronic component (Act 214).

The impedance for electrical discharge, which typically has much lower transconductance or edge steepness than the high-frequency interference referred to, of the electrical connection, formed by the branch line 8 and the bonding wire 23, may be low. Via the branch line 8, the bonding wire 13, the bonding wires 10 and 11 and/or the bonding wire 12, there is a low-resistance propagation path for electrostatic discharge between the first external ground line 5 and the second external ground line 7. The solution thus provides effective protection from electrostatic discharge and also isolation of the circuit portions 2 and 3 with respect to high-frequency interference.

Figure 3:
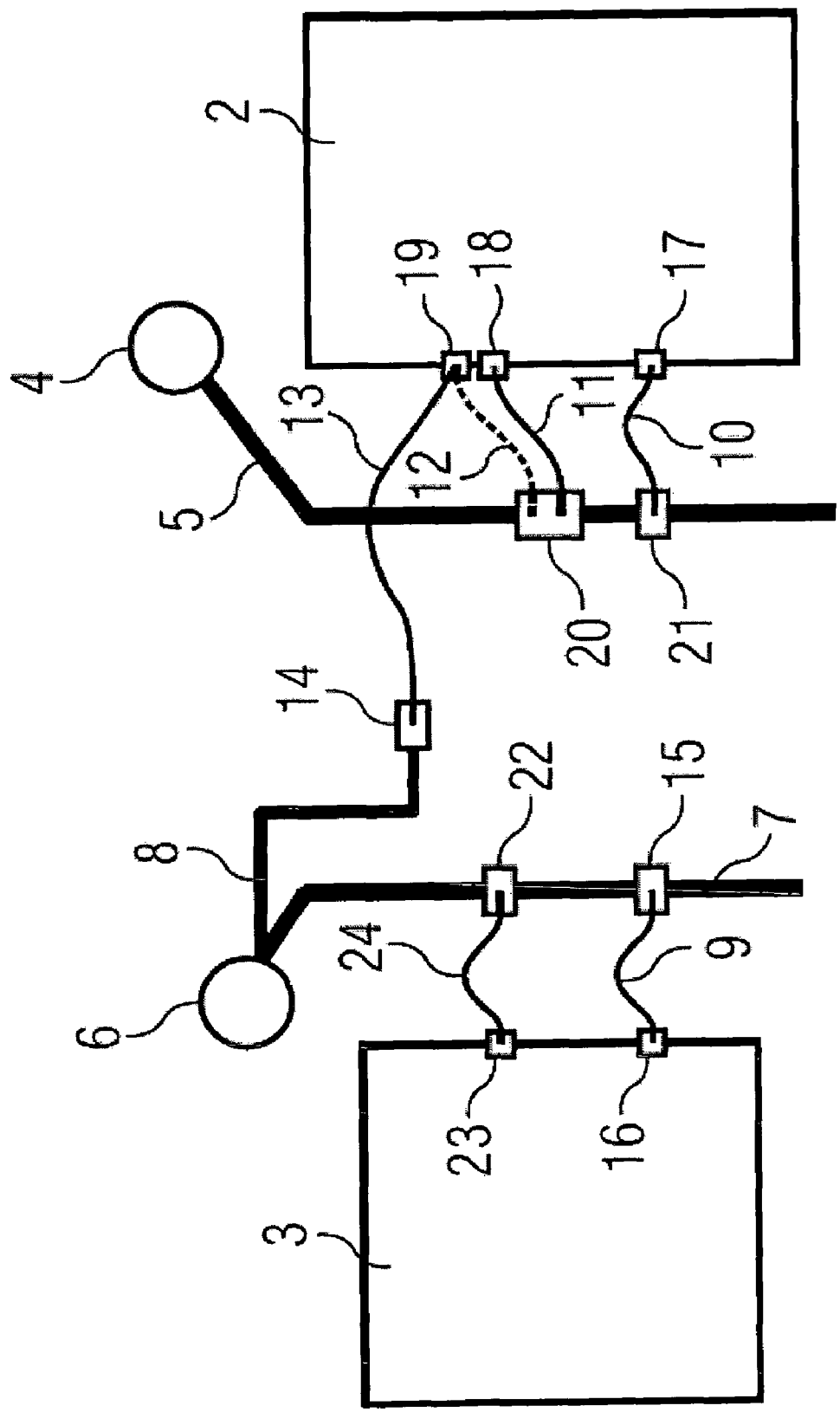
FIG. 3 illustrates a second example protective assembly for electrostatic discharge protection of an electronic component.

FIG. 3 shows a second example protective device. In contrast to the electronic component illustrated in FIG. 1, the first circuit portion 2 and the second circuit portion 3 in FIG. 3 are not integrated on a single chip in an integrated circuit, but rather are located on two separate chips integrated in a single electronic component. A further ground connection 23, which is connected to a bondpad 22 of the second external ground line 7 via a bonding wire 24, is also, for example, provided at the second circuit portion 3. The number of ground connections at the circuit portions 2 and 3 and the number of bondpads at the external ground lines 5 and 7 are selected in accordance with the configuration of the respective circuit portions 2 and 3.

Apart from these changes, the electronic component shown in FIG. 3 corresponds to that shown in FIG. 1. The mode of operation of the electrical connection according to the invention, consisting of the branch line 8 and 13, also corresponds to the example from FIG. 1.

A combination of the electronic component of FIG. 1 with the electronic component of FIG. 3 is, of course, also possible. The circuit portion 2 from FIG. 3, like the chip 1 from FIG. 1, may include an interference-susceptible circuit portion and a circuit portion potentially producing high-frequency interference. The electrical connection cause the bonding wire 13 from FIG. 3 to lead to a ground connection of the portion of the circuit portion 2 that potentially causes interference, so the "interferer domains" are coupled to one another. The interference-susceptible part of the circuit portion 2 from FIG. 3 might then, for example, be coupled, using a further circuit arrangement of this type as shown in FIG. 1, to the part potentially causing interference. The interference-susceptible part of the circuit portion 2 would therefore be isolated even more effectively from the circuit portion 3 with respect to high-frequency interference.

The electrical connection, consisting of the branch connection 8 and bonding wire 13, may also be formed, under corresponding spatial conditions in the electronic component, merely by a bonding wire having corresponding inductance, or in a different manner, provided that there is sufficient inductance for interference isolation and, that propagation of electrostatic discharge via the supply voltage system is easily possible.

The solder balls 4, 6 may also be replaced by other external terminals, for example pins of a pin grid array.

Figure 4:
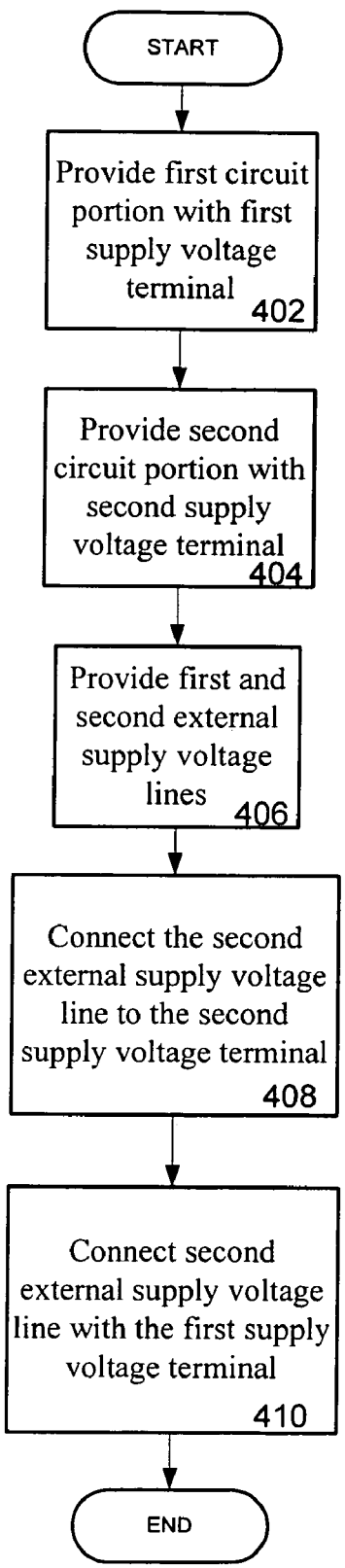
FIG. 4 illustrates acts that produce a protective assembly.

FIG. 4 illustrates interrelated acts that produce a protective assembly for protecting an electronic component from electrostatic discharge. The process includes providing the electronic component, such as that illustrated in FIGS. 1 or 3, having a first circuit portion having a first supply voltage terminal (Act 402). A second circuit portion having a second supply voltage terminal is provided (Act 404). A first external supply voltage line that supplies supplies the first circuit portion, and a second external supply voltage line that supplies supplies the second circuit portion is provided (Act 406). The second supply voltage terminal is connected to the second external supply voltage line (Act 408). The process provides an electrical connection, which is not in communication with the first external supply voltage line, between the second external supply voltage line and the first supply voltage terminal (Act 410).

The invention claimed is:

1. A method for producing a protective assembly for protecting an electronic component from electrostatic discharge, comprising:

providing the electronic component comprising a first circuit portion having a first supply voltage terminal, a second circuit portion having a second supply voltage terminal, a first external supply voltage line that supplies the first circuit portion, and a second external supply voltage line that supplies the second circuit portion, the second supply voltage terminal connected to the second external supply voltage line, and providing an electrical connection, not in communication with the first external supply voltage line, between the second external supply voltage line and the first supply voltage terminal.

2. The method according to claim 1, wherein providing the first supply voltage terminal comprises providing the first supply voltage terminal not connected to the first external supply voltage line.

3. The method according to claim 1, wherein providing the first circuit portion comprises providing a third supply voltage terminal, which is connected to the first external supply voltage line.

4. The method according to claim 1, wherein providing the electrical connection comprises providing at least one of a bonding wire and a metal layer.

5. The method according to claim 1, wherein providing the electrical connection comprises providing the electrical connection comprising a higher impedance for a high-frequency interference occurring in the electronic component than an impedance of a connection of the second external supply voltage line to an outside of the electronic component.

6. The method according to claim 1, wherein providing the electrical connection comprises designing said electrical connection such that an inductance of the electrical connection is between 5 and 15 nH.

7. The method according to claim 1, wherein providing the electrical connection comprises providing the electrical connection as an electrical connection in a package of the electronic component.

8. An electronic component comprising:

a first circuit portion having a first supply voltage terminal, a second circuit portion having a second supply voltage terminal, a first external supply voltage line operable to supply the first circuit portion, a second external supply voltage line operable to supply the second circuit portion, where the second supply voltage terminal is connected to the second external supply voltage line, and an electrical connection, not in communication with the first external supply voltage line, between the second external supply voltage line and the first supply voltage terminal.

9. The electronic component according to claim 8, wherein the first supply voltage terminal is connected to the first external supply voltage line.

10. The electronic component according to claim 8, wherein the first circuit portion comprises a third supply voltage terminal, which is connected to the first external supply voltage line.

11. The electronic component according claim 8, wherein the electrical connection comprises at least one of a bonding wire and a metal layer.

12. The electronic component according to claim 8, wherein the electrical connection is designed in such a way that it has a higher impedance for high-frequency interference occurring in the electronic component than an impedance of a connection of the second external supply voltage line to an outside of the electronic component.

13. The electronic component according to claim 8, wherein an inductance of the electrical connection is between 5 and 15 nH.

14. The electronic component according to claim 8, wherein the first supply voltage line, the second external supply voltage line and the electrical connection are disposed in a package of the electronic component.

15. The electronic component according to of claim 8, wherein the first circuit portion and the second circuit portion comprise semiconductor circuits integrated on a chip.

16. The electronic component according to claim 8, wherein the first circuit portion and the second circuit portion comprise semiconductor circuits produced on two separate chips.

17. The electronic component according to claim 8, wherein the first circuit portion comprise an interference-susceptible circuit portion and the second circuit portion comprises a circuit portion potentially causing interference.

18. The electronic component according to claim 8, wherein the first external supply voltage line and the second external supply voltage line comprise ground lines.

19. The electronic component according to claim 8, wherein the first external supply voltage line and the second external supply voltage line are each connected to an external terminal of the electronic component.

20. The electronic component according to claim 8, wherein the first circuit portion comprises an interference-susceptible part and a non-interference-susceptible part, and wherein the first supply voltage terminal comprises a supply voltage terminal of the non-interference-susceptible part of the first circuit portion.

* * * * *